United States Patent [19]
Schauder

[11] Patent Number: 5,347,166
[45] Date of Patent: Sep. 13, 1994

[54] APPARATUS AND METHOD FOR SWITCHING HIGH POWER LEVELS

[75] Inventor: Colin D. Schauder, Murrysville, Pa.

[73] Assignee: Electric Power Research Institute, Palo Alto, Calif.

[21] Appl. No.: 11,956

[22] Filed: Feb. 1, 1993

[51] Int. Cl.⁵ .......................................... H01H 33/00
[52] U.S. Cl. .................................. 307/113; 307/112; 307/139
[58] Field of Search ........................ 200/144 R, 145; 307/112, 113, 115, 116, 139

[56] References Cited

U.S. PATENT DOCUMENTS

| | | | |
|---|---|---|---|
| 4,095,123 | 6/1978 | Takahashi | 307/113 |
| 4,480,193 | 10/1984 | Blahous et al. | 307/113 |
| 4,484,086 | 11/1984 | Koppl | 307/113 |
| 4,742,243 | 5/1988 | Zabar et al. | 307/81 |
| 4,814,559 | 3/1989 | Stegmüller | 200/145 |
| 5,055,721 | 10/1991 | Majumdar et al. | 307/570 |

*Primary Examiner*—Jeffrey A. Gaffin
*Attorney, Agent, or Firm*—Flehr, Hohbach, Test, Albritton & Herbert

[57] ABSTRACT

A valve for rapidly switching high voltage at high currents includes several identical modules series-coupled between the high voltage rails. Each module includes a three-terminal semiconductor voltage controlled gate turn-off device ("VCGTO"), an input port for receiving a preferably optically coupled gate drive signal, input circuitry, two power switching ports coupled to the VCGTO device output terminals, and an output circuit coupled across the device output terminals. The input circuitry includes an interface circuit and a drive circuit for driving the VCGTO device in response to the gate drive signal, while the output circuit includes a clamping mechanism and regulated clamp voltage circuit that maintains a safe, regulated maximum differential potential across the VCGTO device. The regulated clamp voltage circuit derives its operating potential from the high voltage switched by the associated GTO device, and provides therefrom a regulated low voltage potential that operates the associated input interface and gate drive circuitry. Because each module is identical, any non-simultaneous switching of the various devices in the series-coupled modules causes only a slight disparity in the amount of energy absorbed by each regulated clamp voltage circuit. Further, each module sees substantially the same differential potential between the module output ports, and operates independently regardless of where in the series-coupled chain the module is located. Dynamic voltage sharing among the various modules is assured, and the valve may be operated at a relatively rapid switching frequency, as no snubber is required.

19 Claims, 4 Drawing Sheets

APPARATUS AND METHOD FOR SWITCHING HIGH POWER LEVELS

FIELD OF THE INVENTION

This invention relates to switching high power levels, and more specifically to circuits and procedures for such switching using series-coupled devices, including semi-conductor devices.

BACKGROUND OF THE INVENTION

In many high power applications it is necessary to switch high voltage and high current levels. For example, a power utility company must frequently provide high potentials (e.g., many kV) to avoid having to provide unmanageably large current levels (e.g., hundreds or thousands of amperes). Further, if high potentials can be suitably switched, it is often possible to operate equipment directly from the alternating current high distribution lines, without the cost of providing a suitable transformer.

It is known in the art to use series-coupled thyristors to switch high voltage levels, especially at distribution line potentials. Thyristors are three terminal devices that have high voltage and high current ratings, but unfortunately do not turn-off in response to a signal applied to the device gate input terminal. Once turned on by a gate current input signal, thyristors remain latched in the on state until the signal at the output terminals is interrupted, thus permitting the thyristor to turn off. For this reason, thyristors are typically used in power converter applications where commutation occurs naturally. In a natural commutation application, if a second device is turned on before a first device is turned off, it is understood that current from the first device will automatically be diverted to the second device, whereupon the first device turns off. However, thyristors are not preferred in inverter or pulse width modulation applications because of the complex (and power consuming) auxiliary commutation circuitry required to forcibly commutate or properly turn off the devices.

More recently, gate turn-off thyristors ("GTOs") have been used in high potential switching applications where natural commutation does not occur. A GTO is a three terminal device somewhat similar to a conventional thyristor, except that the GTO can turn off in response to a typically large current signal at its gate input terminal. GTOs are commonly used in traction applications to implement direct current choppers, and GTOs have been proposed for use in static condenser applications and energy storage schemes. Like thyristors, GTOs have a relatively low intrinsic dV/dt limitation (e.g., 500 V/μs) that requires external components to ensure that the rate of voltage change across the device after turn off does not exceed the limitation. Typically large snubber capacitors (e.g., 5 μF) are used for this purpose, but unfortunately dissipate considerable energy, and limit the practical switching frequency of circuits using GTOs. Essentially, whatever energy is stored in the snubber capacitor after turning off the GTO is dissipated when the device is next turned on. Thus, for each off-on GTO cycle, one "quantum" of snubber energy is dissipated, and attempting to increase the GTO switching rate beyond say 180 Hz increases the snubber losses to an unacceptable level.

As such, GTOs are not useful for applications, where, for example, a high switching frequency is desired to reduce low order harmonic distortion of the voltage or current waveform. For the same reason, it is difficult to construct a fast pulse-width modulated inverter using GTOs for operation directly from high voltage alternating current lines, for example, to form an active filter and volt-ampere reactive ("var") compensator.

In high voltage, high-current switching applications, several devices (thyristors, GTOs, and the like) are series-coupled such that the voltage across any one device is less than the device breakdown voltage. Understandably it is important that the high voltage be dynamically shared among the series-coupled devices during turn-on and turn-off transitions.

While each series-coupled device may experience the same differential high voltage potential, devices coupled at the "top" of the series are at a higher absolute potential compared with devices coupled at the "bottom" of the series. Because of the higher absolute voltage potentials seen by the devices nearer the "top" of the series, it is often difficult to safely provide proper gate drive signals to the various devices. For the same reason, the generation of power to operate the various gate drive circuits can also be troublesome.

What is needed is an apparatus and method for safely switching high voltage at high current levels, especially in applications where natural commutation need not occur. Preferably such apparatus and method should operate using series-coupled three terminal devices, which devices are commercially available, self-contained, and modular. Further, such apparatus and method should not require snubbers with their excessive power dissipation and high frequency switching limitations.

In addition, there is a need for a means to modularize each series-coupled device and its associated circuitry, and to provide safe isolation from high voltage potentials seen by the various devices. Finally, the gate drive circuitry used to drive such devices preferably should derive operating power from the high voltage seen by each device, and dynamic voltage sharing should be ensured among the various series-coupled devices. The present invention discloses such an apparatus and method fulfilling these needs.

SUMMARY OF THE PRESENT INVENTION

The present invention provides an apparatus and method for switching high power levels, using series-coupled devices that preferably are voltage controlled gate turn-off devices ("VCGTO") such as insulated gate bipolar transistors ("IGBT"), metal-oxide-silicon ("MOS") controlled thyristors ("MCT"), or power metal-oxide-silicon field effect transistors ("MOS-FETS"). Unlike GTOs, VCGTO devices advantageously have substantially no dV/dt limitation, and may be used in high frequency applications (e.g., switching rates in the 2 KHz to 10 KHz range) as no heat dissipating snubbers are required, and internal switching losses are small.

Preferably each VCGTO and its associated circuitry forms a module, where a number (N) of such identical modules are series-coupled between the high voltage rails to be switched. Each module includes an input port for receiving a gate drive signal, input interface and gate driving circuitry, a VCGTO device having a gate input terminal and first and second output terminals, two power switching ports coupled to the output terminals of the VCGTO device, and a clamping mechanism and regulated clamp voltage circuit coupled across the VCGTO device output terminals.

The input interface and gate driving circuitry receives a gate drive signal that is preferably optically coupled and provides a corresponding voltage input signal to the gate of the VCGTO device.

The clamping mechanism and regulated clamp voltage circuit are coupled across the output terminals of the VCGTO device to clamp the first (high potential) output terminal of the device to a potential determined by the regulated clamp voltage circuit. As such, the maximum differential potential between the output terminals of the VCGTO device is maintained under all conditions at a predetermined safe level, well within the breakdown voltage rating of the device. The regulated clamp voltage circuit derives its operating potential from the high voltage switched by the associated VCGTO device. The regulated clamp voltage circuit also provides from this derived potential a regulated low voltage potential that operates the associated input interface and gate drive circuitry. In this fashion, the module is self-contained and derives its own operating power from the high potential to be switched.

Preferably each module is identical, as is each device. Thus, any non-simultaneous switching of the various devices in the series-coupled modules causes only a slight disparity in the amount of energy absorbed by each regulated clamp voltage circuit. Because each module is identical and sees substantially the same differential potential between the module output ports, the modules operate independently regardless of where in the series-coupled chain they are located. Thus, apart from mechanical considerations, as many modules as desired may be series-coupled between the high potential rails to form a single switch or valve.

As such, a valve according to the present invention is assured of dynamic voltage sharing among the various modules, and may be operated at a relatively rapid switching frequency, as no snubber is required. Finally, because the devices are preferably VCGTOs, the invention may be used in applications where commutation does not occur naturally.

In a second aspect, a method of switching high voltage at high current using series-coupled devices is disclosed. The method requires series coupling a stack of preferably identical modules, each module containing a three terminal device, an isolated drive mechanism for controlling the device in response to an input signal, and a regulated clamp voltage mechanism coupled across the device's output terminals, wherein operating potential for the two mechanisms is derived from the high voltage potential switched by the device.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 1:
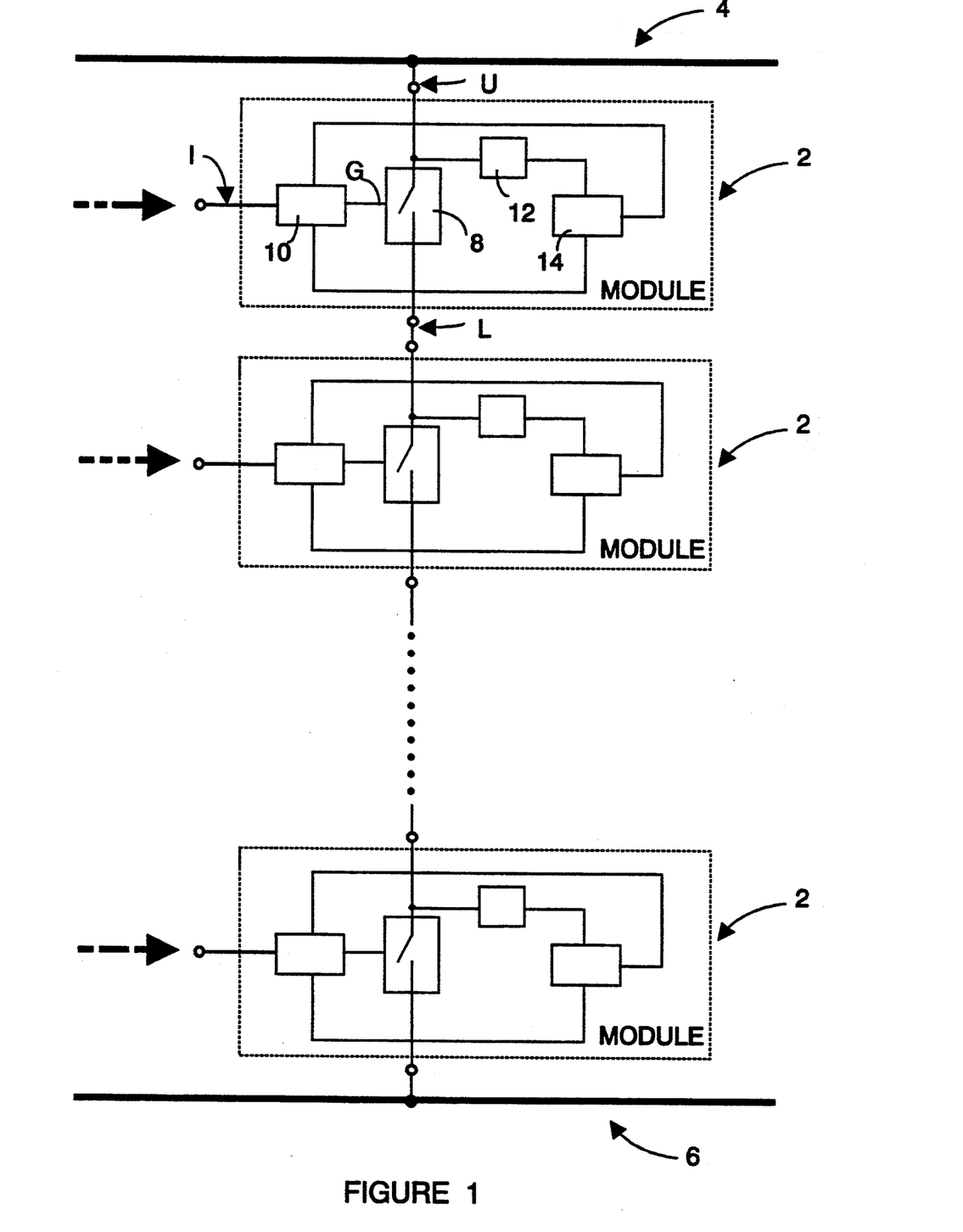
FIG. 1 depicts a valve for safely switching high voltage at high current using series-coupled modules, according to the present invention.

FIG. 1 depicts a valve apparatus according to the present invention as preferably including several self-contained modules 2, coupled in series between an upper potential rail 4 and a lower potential rail 6 to form a high voltage switching valve. Preferably each module 2 is identical and includes a three terminal solid state switch device 8, an input interface and drive mechanism 10, a clamp mechanism 12, and a regulated clamp voltage source 14. Each module has an upper and lower electrical port, respectively denoted U and L, and an input port I for receiving an input signal (shown by dashed arrow) that causes the switch to turn on and off.

When the valve is switched on, all modules pass a current that flows from rail 4 to rail 6, and when the valve is switched off, this current is blocked. Depending upon the application, rail 4 may be, for example, the power source, and rail 6 may be the output terminal of the valve apparatus.

The drive mechanism 10 is coupled between the input port I and the input terminal G of the switch device 8. Preferably the switch device 8 is a voltage controlled gate turn-off device ("VCGTO") such as an insulated gate bipolar transistor ("IGBT") or a metal-oxide-silicon controlled thyristor ("MCT"). As noted, such devices have essentially no dV/dt limitation and thus do not require an energy dissipating snubber. The switch device 8 has a first output terminal coupled to the upper port U, and a second output terminal coupled to the lower port L. For example, device 8 may be a 300 ampere, 1.2 kV IGBT, such as a Toshiba MG300Q1US1, a device having an essentially unlimited dV/dt rating.

Collectively, the clamp mechanism 12 and regulated clamp voltage source 14 are coupled across the output terminals of device 8, and ensure that the maximum differential voltage appearing across the output terminals is within the maximum breakdown voltage of device 8. As depicted in FIG. 1, the regulated clamp voltage source 14 derives its operating potential from the switched potential appearing across the device output terminals (or the U and L output ports), and provides from this derived potential operating voltage for the drive mechanism 10. Operating potential for the regulated clamp voltage source 14 (and thus for drive mechanism 10 as well) is assured. This is true even during initial system turn-on, providing that the valve blocks full rail-to-rail voltage whenever the valve is switch off.

Figure 2:
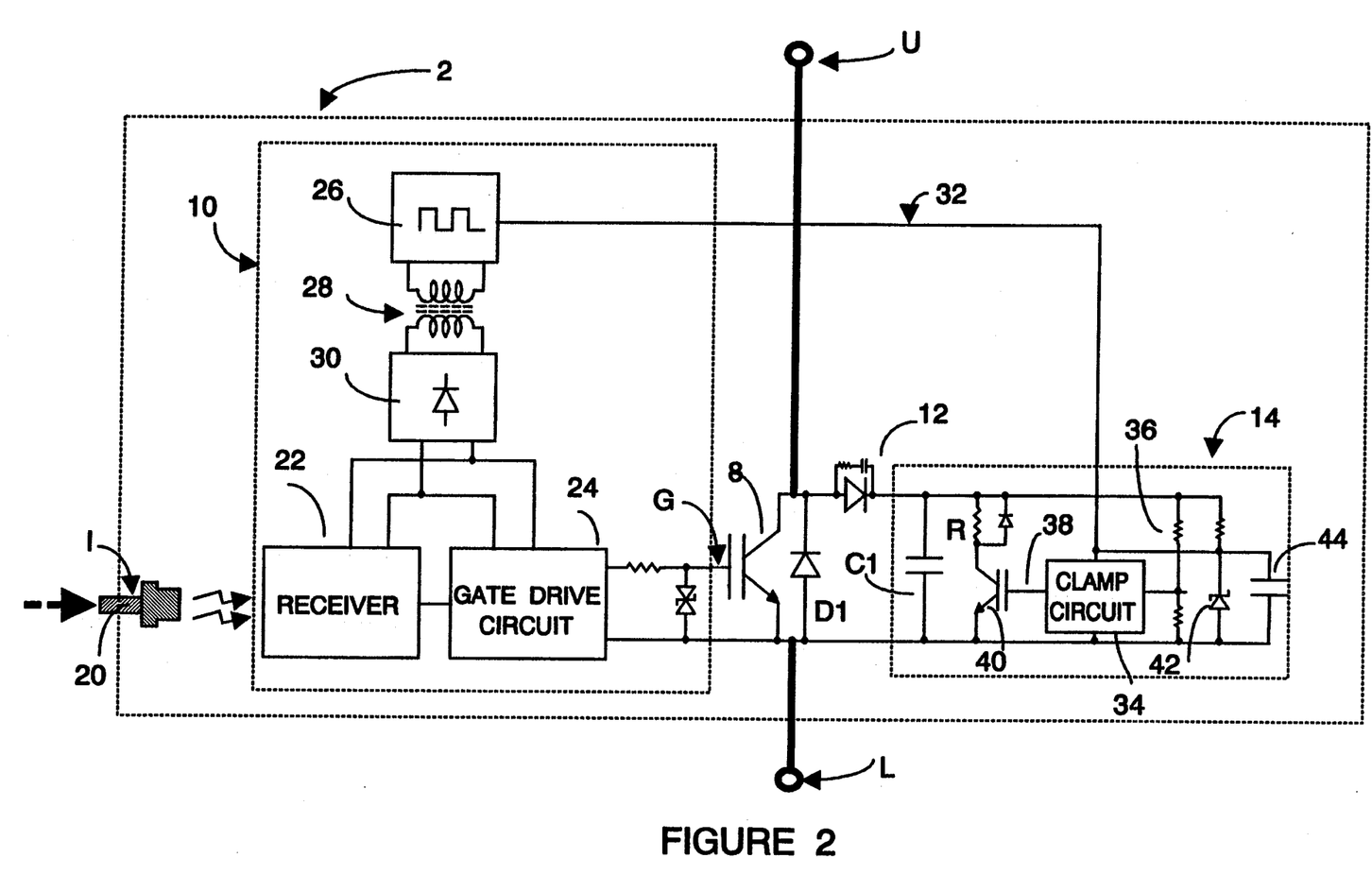
FIG. 2 is a schematic representation of a module, according to the present invention.

FIG. 2 depicts in greater detail the components comprising module 2. According to the present invention, the potential difference between rails 4 and 6 may be many thousands of volts, at a current level of tens or hundreds of amperes, and the potential difference between a module's U and L output ports may be a thousand volts or so. It is understood that if the potential difference between rails 4 and 6 is, say, 20 kV, and if the maximum voltage a module 2 can safely sustain between its ports U and L is only 1.2 kV, that the number (N) of modules 2 that will be series coupled will be 20/1.2 or 16.7, e.g., 17 modules or more. Typically more than N modules will be used, to provide safety margin and redundancy.

For safety and isolation considerations, preferably the input signal (depicted by dashed arrow) is coupled to the input port I of device 2 via a fiber optic cable 20. The input signal is essentially a train of "on" and "off" pulses, whose switching frequency preferably is in the range of about 3 KHz to about 10 KHz, and a duty cycle essentially variable from zero to 100%. The input signal typically is provided, via fiber optic cable 20, by a main control circuit (not shown).

As depicted in FIG. 2, drive mechanism 10 preferably includes an optical receiver 22 whose output is electrically coupled to a gate drive circuit 24 whose output is floating. Operating potential for receiver 22 and circuit 24 is provided by a DC-DC converter comprising oscillator 26, isolation transformer 28 and a low voltage "H" bridge rectifier 30. The use of such a DC-DC converter with transformer isolation permits circuit 24 to deliver a bipolar drive voltage signal to the input gate terminal G of device 8. Preferably this drive signal is about ±15 V relative to the potential at output port L) and replicates the input signal received at the input port I. Of course alternative circuitry may be employed to provide a suitable signal to input gate terminal G. While a bipolar input gate signal is not required to control device 8, preferably a bipolar drive signal is used to minimize spurious control of device 8 due to voltage coupling through stray capacitance between the output port L and the device gate terminal G.

Diode D1 is typically integrally mounted within the device 8 package to provide protection against reverse voltage across output ports U and L, by providing a safe path for current flow from port L to port U. Diode 12 performs a clamping function, preventing the output port U's potential from rising substantially higher than the potential at the upper lead of capacitor C1. Preferably capacitor C1 is implemented as two capacitors in parallel, a relatively small capacitor (e.g., 0.1 $\mu$f) and a larger capacitor (e.g., 15 uF). Two capacitors are preferably used to implement C1, to minimize voltage drop in the current loop comprising diode 12, capacitor C1 and device 8 (which includes diode D1 internally) due to unavoidable resistance and inductance. The smaller 0.1 $\mu$f capacitor can be mounted more intimately to device 8 and diode 12, while permitting the larger capacitor to be mounted several inches (e.g., 5 cm or so) distant. Of course the voltage rating for the capacitors comprising C1 should exceed the highest differential potential to which output ports U and L will be exposed, e.g., about 1 kV.

Regulated clamp voltage source 14 includes capacitor C1, which charges positively toward the potential present at output port U when device 8 is turned off, and a clamp voltage regulator circuit 34 that senses (via a resistor divider chain 36) and stabilizes the potential across capacitor C1. The output from circuit 34 is coupled via lead 38 to the input of a smaller IGBT or MCT device 40. A commercially available 8 ampere, 1.2 kV IGBT may be used for device 40, although many applications require less than one ampere to be conducted by device 40.

When device 8 is turned on, the voltage differential between output ports U and L is essentially zero. The voltage across capacitor C1 will tend to remain constant, as diode 12 is now reverse biased. In practice the potential across C1 is maintained at a level less than the breakdown rating of device 8, and is typically about 800 V, where device 8 is rated at about 1.2 kV. This allows a comfortable margin to accommodate parasitic transient effects due to stray inductance associated with the clamp mechanism.

However as device 8 turns off (in response to a signal at the input port I), the current through device 8 falls rapidly, and the current flowing from output port U begins to divert through diode 12 into capacitor C1. Capacitor C1 is sufficiently large that for typically several microseconds there is no appreciable change in voltage across C1. The potential at output port U at this time is about one diode drop (e.g., diode 12) higher than the potential at the top of C1.

By design, this potential exceeds the potential in the main power circuit by about 20%, thus causing the main circuit load current through this module to decrease rapidly. As will be apparent in the particular application depicted in FIG. 3 (to be described), the main power circuit current that had been flowing through this module commutates around the system DC link capacitor, and flows through the corresponding diodes D1 in the opposing module arm in the same pole. This commutation takes place rapidly, perhaps over a 1 $\mu$s interval, at the end of which interval the current flow through diodes 12 and capacitor C1 is reduced to nil. As device 8 turns off, the current flow through capacitor C1 rises rapidly from zero to the peak current that had been flowing through device 8, and then falls to zero quickly.

During typically several of these 1 $\mu$s or so intervals, the potential at the top of C1 begins to rise, as does the differential voltage between output ports U and L, during turn-off. When the differential potential across capacitor C1 exceeds a predetermined maximum level (typically about 800 V) determined by circuit 34 and divider chain 36, circuit 34 turns on the device 40. When turned on, device 40 begins to discharge the potential across capacitor C1, via a 200 W or so current limiting series resistor R that provides a substantially greater power drain from capacitor C1 than the anticipated peak clamp power for each level of module 2 comprising the overall valve.

When device 40 is turned on by circuit 34, C1 discharges through resistor R until a lower threshold voltage is attained, at which level circuit 34 turns off device 40, allowing C1 to once again charge via diode 12 to the potential at output port U. However, when the predetermined maximum level is exceeded, circuit 34 again turns on device 40, thus regulating the potential difference across capacitor C1, and thus across output ports U and L. In some applications, the resistor chain 36 may itself be sufficient to dissipate the bulk of the clamp loss across capacitor C1, in which case device 40 is seldom turned on by circuit 34. In practice, the difference between the upper and lower threshold levels associated with the regulated clamp voltage source 14 is easily held to a few percent of the maximum DC voltage level appearing across output ports U and L. Details of the clamp voltage regulator circuit 34 are not provided as such circuitry is well known to those skilled in the art of power supply design.

A low voltage zener diode 42 (e.g., 15 V) and storage capacitor 44 (e.g., 15 $\mu$F) are coupled across capacitor C1 via a current-limiting resistor to provide a regulated low operating potential (e.g., 15 VDC) that is coupled via lead 32 to power the input interface and drive mechanism 10.

Each module is self-contained with an optically coupled input port I, with only two electrical connections to the outside world (e.g., a U output port coupled to the L output port of the module above it, and an L output port coupled to the U output port of the module below it). As such, the N modules comprising a valve function independently of each other, without knowledge of where in the series-coupled chain of modules it is located. Thus, with reference to FIG. 1, although the uppermost module 2 is coupled to the upper potential rail 4, and sees a higher absolute potential relative to the lower potential rail 6 than the other modules 2 see, it operates precisely as though it were the lowermost module whose L output port was coupled directly to the lower voltage rail 6.

Analysis of clamp diode 12 and circuit 14 indicates that clamp power dissipation is only about 150 W to 200 W per module in an application wherein a 13.8 kV inverter is switched at 3 kHz with 300 amperes peak current. Considering the relatively small amount of energy involved, recovery of this energy would require transformers and would be impractical.

The valve design is not particularly dependent on the switching characteristics of device 8, and does not require special precautions to ensure dynamic voltage sharing. The above-described operation of diode 12 and circuit 14 hold the differential voltage across each device 8 (e.g., across output ports U and L) to a safe maximum level under all conditions. As such, the only consequence of non-simultaneous switching of series-coupled modules in a valve is a slight disparity in the amount of energy absorbed by diode 12 and circuit 14. In practice, however, the switching characteristics of IGBT type devices 8 are sufficiently close. Modern IGBT devices have a total turn-on or turn-off transition time of about 1 $\mu$s, and the transition time spread among similar devices is but a small fraction of this time.

Figure 3:
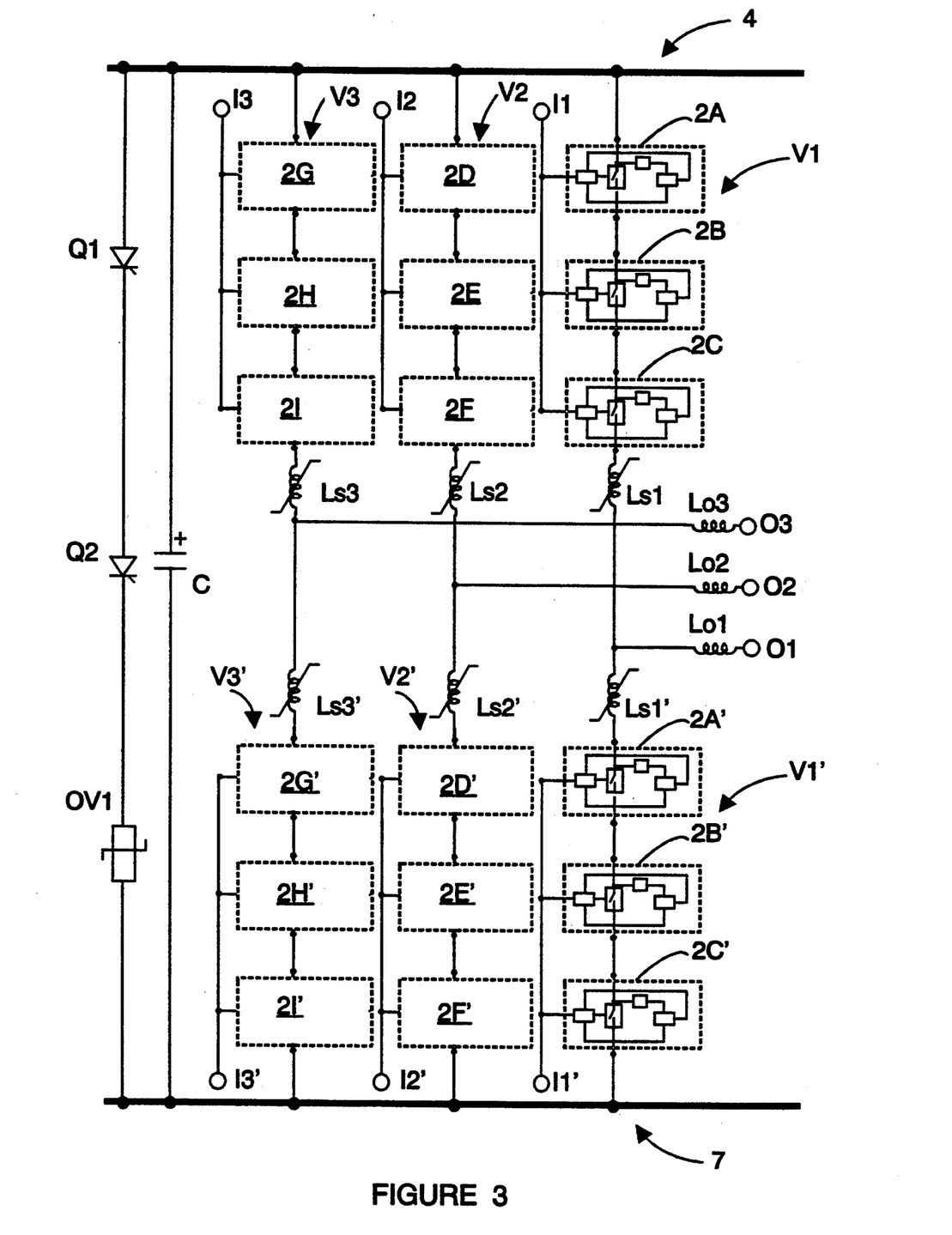
FIG. 3 is a schematic representation of a high voltage pulse width modulator using valves, according to the present invention.

FIG. 3 depicts six high voltage valves V1, V1', V2, V2', V3, v3, each comprising identical modules 2, connected to form a pulse-width modulated inverter coupled directly to a high-voltage AC line. For example, valve V1 includes series-coupled modules 2A, 2B, 2C, whose gate input terminals are driven from a common light source via input port I1. Valve V1' includes series-coupled modules 2A', 2B', 2C' whose input gate terminals are driven from a common light source via input port I1', and similarly, valve V2 comprises modules 2D, 2E, 2F whose input terminals are driven via input port I2, and so on. Together valves V1, V1' form a pole, as do valves V2-V2', and valves V3-V3'.

In the embodiment shown, the upper and lower valves in each pole function in push-pull fashion. That is, when V1 is on, V1' is off, and vice versa. Similarly valves V2 and V2' and V3 and V3' are turned on and off in push-pull fashion. The circuitry for delivering input turn on, turn off signals to ports I1, I1', I2, I2', I3, I3' (preferably via fiber optic cables) is not depicted as the design of such circuits is well known to those skilled in the relevant art. It is understood, however, that input signals I1, I1' will be complementary, as will signals I2, I2', and signals I3, I3'. Depending upon the specific application, the various input signals will be pulses, typically with a desired phase or time shift between input signal I1, I2 and I3.

As shown in FIG. 3, valves V1 and V1' are series coupled between high voltage rails 4, and 7, as are valves V2, V2' and V3, V3'. Preferably saturable inductors Ls1, Ls2, Ls2, Ls1', Ls2', Ls3' are placed in series between the series coupled valves, e.g., inductors that upon conducting a predetermined saturation current no longer look inductive. The use of such saturable inductors reduces turn on loss, and softens the recovery for the clamp diodes 12 associated with each module. Isolation inductors Lo1, Lo2, Lo3 are coupled in series between the series coupled saturable inductors and the output ports, e.g., O1, O2 and O3.

To protect the valves against over-voltage surges, preferably thyristors Q1, Q2 and over-voltage arrestor OV1 are collectively series coupled between the rails 4 and 7. A capacitor C is also coupled across the rails to maintain the DC source voltage, and to provide an alternating current path for commutation current, as will now be described. Depending upon the system application, capacitor C may have a value of perhaps 200 $\mu$f, with a working voltage at least as great as the highest potential experienced between the rails.

Assume that the input signal coupled to input port I1 turns on valve V1, e.g., turns on modules 2A, 2B, 2C. Current from rail 4 passes through valve V1, through inductors Ls1 and Lo1 and out through output port O1 into a load (not shown). When valve V1 is on, the output voltage at port O1 will rise essentially to the potential at rail 4, about 2 kV for the embodiment of FIG. 3. While valve V1 is on, the current flow through the valve is high (about 200 amperes), but the potential dropped across valve V1 is relatively low.

When the input signal to port I1 causes valve V1 to turn off, the current through valve V1 will begin to fall rapidly. At essentially the same time, as valve V1 turns off, the complementary input signal at input port I1' turns on valve V1', causing the potential at output port O1 to fall rapidly to the lower rail potential, typically ground. As has been described with respect to FIG. 2, as valve V1 begins to turn off, the potential across it will increase from essentially zero to a potential exceeding the rail-to-rail potential by perhaps 20%.

The current previously flowing from rail 4 into valve V1 will now be diverted through capacitor C and bottom rail 7, and will flow through the diodes D1 associated with the device within each module 2A', 2B', 2C' in valve V1'. This diverted current then flows through inductors Ls1', and Lo1 and into output port O1. This current is diverted or commutated within a short time period, typically a few microseconds. Thus, as one valve turns off, its complementary pole valve turns on. For example, valve V1 turns on, then valve V1', then valve V2, then V2', then V3, V3', and then V1 again. As noted, the duty cycle and switching repetition rate for the different valves may vary from essentially zero to one hundred percent, depending upon the application at hand.

Figure 4A:
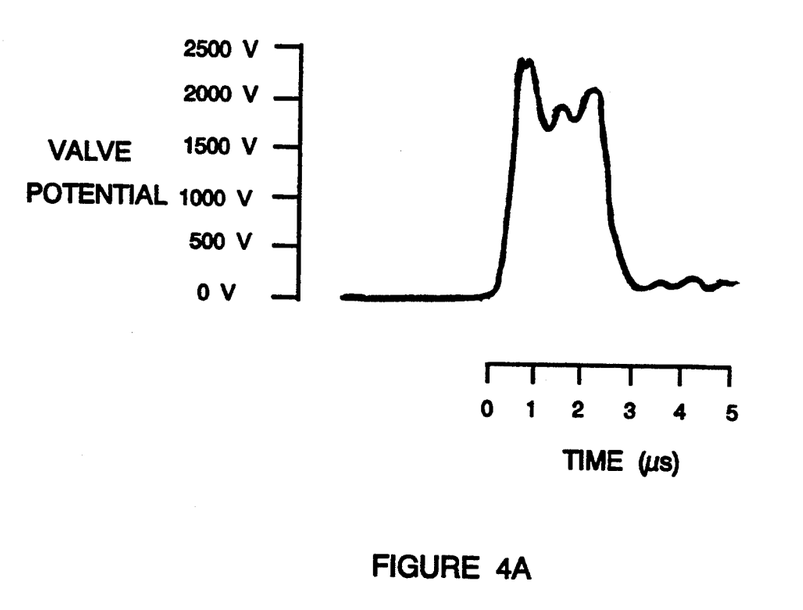
FIGS. 4A and 4B depict voltage and current waveforms, as seen by a valve in the embodiment of FIG. 3.
Figure 4B:
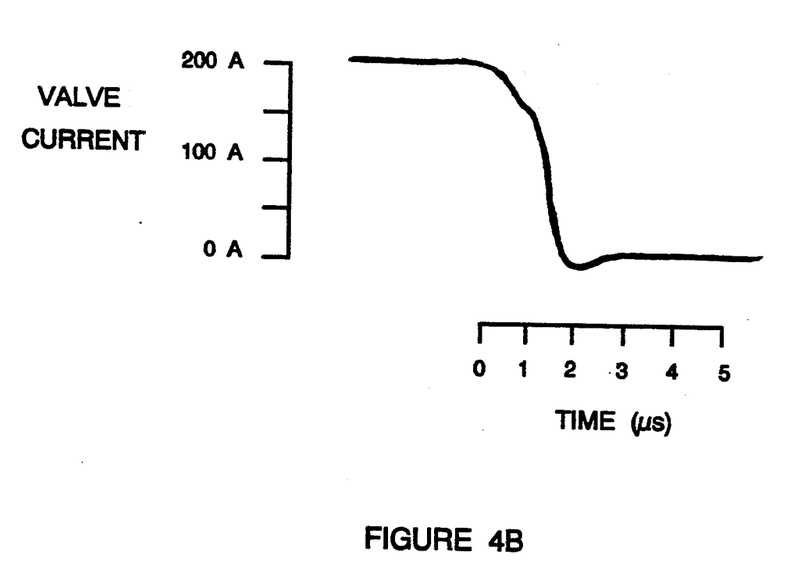

FIGS. 4A and 4B depict, respectively, the voltage dropped across valve V1 (e.g., from rail 4 to output port O1), and the current conducted by valve V1 before and after a turn-off of valve V1. In the particular application depicted, the voltage differential between rails 4 and 7 was only a few hundred volts. Hence the voltage across V1 rises to the clamp voltage during commutation, and then falls to a few hundred volts. Of course the waveforms depicted for V1 are equally applicable to the other valves as well. Before time zero, valve V1 is on, and thus the potential drop across it is essentially zero, and the current conducted is maximum, about 200 amperes. At time zero, input signal I1 and I1' respectively cause valve V1 to turn off and valve V1' to turn on.

As shown in FIG. 4A, within a few hundred nanoseconds after time zero, the voltage across valve V1 rises, over-shoots (due to inductance present in each module in the loop including device 8, diode D1, diode 12, capacitor C1), and begins to settle towards a steady-state level (about 2 kV). As shown in FIG. 4B, within about 1 $\mu$s, the current through valve V1 drops from a peak (200 amperes) to essentially zero as the valve turns off. Once the turn-off commutation is complete, the voltage across V1 drops to equal the voltage across capacitor C, a few hundred volts in this application.

In the embodiment of FIG. 3, after valves V1–V1' have been turned on/off, respectively, valves V2–V2' and then V3–V3' are respectively turned on/off. Understandably the modulation sequence of input pulses at input ports I1, I2, I3 can vary with the application at hand. In the preferred embodiment of FIG. 3, the valves are operated as an active filter and voltage-ampere-reactive ("var") compensator.

Of course valves according to the present invention may be used in other high power switching applications, for example in advance static var compensators or static condensers ("STATCONs"). STATCONs are high energy devices (e.g., power levels beyond about 10 MW) used in flexible AC transmission systems, wherein a DC:AC inverter provides reactive power to three-phase transmission or distribution line by circulating current that leads or lags by 90°. STATCONs have no DC-side power source per se, and draw only enough power to satisfy their own losses.

Valves according to the present invention may also be used in a superconducting magnetic energy storing system ("SMES"), wherein inductors store sufficient energy to provide power for a transmission line for pulse power applications, for peak load shaving, supporting voltage busses for short time periods, and the like. Valves according to the present invention may be used as an active line conditioner that is placed in series between the high voltage mains and a non-linear load. The conditioner improves the power quality by maintaining a sinusoidal AC voltage and AC current waveform on the mains, despite perturbations reflected towards the mains by the non-linear load.

Yet another application for valves according to the present invention is in drives for large motors, e.g., 2 MW to about 10 MW. Such motors are typically four quadrant, high horse power, variable speed servo drives and may be found in large factories. To attain sufficiently high horsepower, it is desired to maintain good power factor and low harmonic content. Such motors may be driven either with low voltage at high current, or with high voltage at lower current. As has been described, valves according to the present invention readily allow high voltages (e.g., several kV) to be provided at modest current levels (e.g., 100–500 amperes) to achieve the required power output for such motors.

Other applications of valves constructed according to the present invention will be apparent to those skilled in the relevant art.

Modifications and variations may be made to the disclosed embodiments without departing from the subject and spirit of the invention as defined by the following claims.

What is claimed is:

1. A valve for switching at high current levels a high voltage present between two voltage rails, comprising:
a number N modules coupled in series between said voltage rails, wherein each said module includes:
a switching device having an input terminal, and first and second output terminals, said device switchably coupling together said first and second output terminals in response to a signal at said input terminal;
an input port receiving an input signal;
input means, coupled to said input port, for providing a drive signal to said input terminal of said switching device;
first and second output ports respectively coupled to said first and second output terminals of said switching device; and
output means, coupled between said first and second output terminals of said switching device, for maintaining a predetermined maximum voltage differential therebetween, and further coupled to said input means;
wherein said output means derives its operating potential from said first and second output terminals of said switching device, and provides therefrom an operating potential to said input means.

2. The valve of claim 1, wherein said devices in said modules are switched on and off substantially simultaneously in response to an input signal at each said module's input port.

3. The valve of claim 1, wherein said number N is not less than said high voltage magnitude existing between said rails divided by each said device's maximum breakdown voltage level.

4. The valve of claim 1, wherein said switching device is selected from the group consisting of an insulated gate bipolar transistor, a metal-oxide-silicon controlled thyristor, and a power metal-oxide-silicon field effect transistor.

5. The valve of claim 1, wherein said output means includes a clamp diode and circuit means for deriving and maintaining a regulated clamp voltage;
wherein said clamp diode is coupled between said first output terminal of said device and said regulated clamp voltage, and wherein said regulated clamp voltage is less than said device's maximum breakdown voltage rating.

6. The valve of claim 1, wherein each switching device receives a said drive signal at a repetition rate exceeding about 3 KHz.

7. The valve of claim 1, wherein said valve meets at least one criterion selected from the group consisting of (i) a breakdown potential exceeding a said rail-to-rail high voltage of about 1 kV, and (ii) a current flow through said valve exceeding about 100 amperes.

8. A system for switching at high current levels high voltage present between first and second high voltage rails, the system interposed between said rails and a load, the system comprising:
a first valve comprising a number N modules coupled in series between said first rail and a system output port, wherein each said module includes:
a switching device having an input terminal, and first and second output terminals, said device switchably coupling together said first and second output terminals in response to a signal at said input terminal;
a first input port receiving a first input signal;
input means, coupled to said input port, for providing a drive signal to said input terminal of said switching device;
first and second output ports respectively coupled to said first and second output terminals of said switching device; and
output means, coupled between said first and second output terminals of said switching device, for maintaining a predetermined maximum voltage differential therebetween, and further coupled to said input means;

wherein said output means derives its operating potential from said first and second output terminals of said switching device, and provides therefrom an operating potential to said input means;

a second valve comprising said number N modules coupled in series between said second rail and said system output port, wherein each said module includes:

a switching device having an input terminal, and first and second output terminals, said device switchably coupling together said first and second output terminals in response to a signal at said input terminal;

a second input port receiving a second input signal;

input means, coupled to said input port, for providing a drive signal to said input terminal of said switching device;

first and second output ports respectively coupled to said first and second output terminals of said switching device; and output means, coupled between said first and second output terminals of said switching device, for maintaining a predetermined maximum voltage differential therebetween, and further coupled to said input means;

wherein said output means derives its operating potential from said first and second output terminals of said switching device, and provides therefrom an operating potential to said input means;

wherein said load is coupled to said system output port.

9. The system of claim 8, wherein said first and second input signals are in push-pull relationship causing said first and second valves to turn on and off in push-pull relationship.

10. The system of claim 8, wherein said number N is not less than said high voltage magnitude existing between said rails divided by each said device's maximum breakdown voltage level.

N is not less than said high voltage's magnitude divided by each said device's maximum breakdown voltage level.

11. The system of claim 8, wherein each said switching device is selected from the group consisting of an insulated gate bipolar transistor, a metal-oxide-silicon controlled thyristor, and a power metal-oxide-silicon field effect transistor.

12. The system of claim 8, further including means for optically coupling said first and second input signals to said first and second input ports.

13. The system of claim 8, wherein each said output means includes a clamp diode and circuit means for deriving and maintaining a regulated clamp voltage;

wherein said clamp diode is coupled between said first output terminal of said device and said regulated clamp voltage, and wherein said regulated clamp voltage is less than said device's maximum breakdown voltage rating.

14. The system of claim 8, wherein each said switching device receives a said drive signal at a repetition rate ranging from about 3 KHz to about 10 KHz.

15. The system of claim 8, further including a third valve coupled between said first rail and a second system output port, and a fourth valve coupled between said second rail and said second system output port;

wherein said third and fourth valves are substantially identically to said first and second valves and receive respectively third and fourth input signals, and wherein a second system load is coupled to said second system output port, and wherein said third and forth input signals are in push-pull relationship causing said third and fourth valves to turn on and off in push-pull relationship.

16. The system of claim 15, wherein each said third and forth input signal is delayed with respect to each said first and second input signal.

17. A method for switching at high current levels a high voltage present between two voltage rails, the method comprising:

(a) coupling in series a number N modules between said voltage rails, wherein each module includes:

a switching device having an input terminal, and first and second output terminals, said device switchably coupling together said first and second output terminals in response to a signal at said input terminal;

an input port receiving an input signal;

input means, coupled to said input port, for coupling a drive signal to said input terminal of said switching device;

first and second output ports respectively coupled to said first and second output terminals of said switching device; and output means, coupled between said first and second output terminals of said switching device, for maintaining a predetermined maximum voltage differential therebetween, and further coupled to said input means;

wherein said output means derives its operating potential from said first and second output terminals of said switching device, and provides therefrom an operating potential to said input means;

(b) providing a drive signal to said input terminal of said switching device, wherein said drive signal causes said switching device to switch on or off.

18. The method of claim 17, wherein said switching device is selected from the group consisting of an insulated gate bipolar transistor, a metal-oxide-silicon controlled thyristor, and a power metal-oxide-silicon field effect transistor.

19. The method of claim 17, wherein said output means includes a clamp diode and circuit means for deriving and maintaining a regulated clamp voltage;

wherein said clamp diode is coupled between said first output terminal of said device and said regulated clamp voltage, and wherein said regulated clamp voltage is less than said device's maximum breakdown voltage rating.

* * * * *